(12) United States Patent
Leray et al.

(10) Patent No.: US 9,406,540 B2
(45) Date of Patent: Aug. 2, 2016

(54) SELF-BIAS CALCULATION ON A SUBSTRATE IN A PROCESS CHAMBER WITH BIAS POWER FOR SINGLE OR MULTIPLE FREQUENCIES

(71) Applicant: APPLIED MATERIALS, INC., Santa Clara, CA (US)

(72) Inventors: Gary Leray, Mountain View, CA (US); Valentin Nikolov Todorow, Palo Alto, CA (US); Samer Banna, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 963 days.

(21) Appl. No.: 13/647,624

(22) Filed: Oct. 9, 2012

(65) Prior Publication Data
US 2013/0110435 A1  May 2, 2013

Related U.S. Application Data

(60) Provisional application No. 61/552,561, filed on Oct. 28, 2011, provisional application No. 61/639,406, filed on Apr. 27, 2012.

(51) Int. Cl.
*H01L 21/683* (2006.01)
*G01R 27/16* (2006.01)
*G06F 19/00* (2011.01)

(52) U.S. Cl.
CPC ............ *H01L 21/6833* (2013.01); *G06F 19/00* (2013.01)

(58) Field of Classification Search
CPC ............ H04L 21/6833; H04L 21/6831; H04L 21/683; H04L 21/67069; H04L 21/67253; H02N 13/00; G01R 27/16; G01R 27/08; G01R 29/12
See application file for complete search history.

(56) References Cited

U.S. PATENT DOCUMENTS

2011/0104363 A1* 5/2011 Matsuda ........... H01L 21/67069
427/8

* cited by examiner

*Primary Examiner* — Manuel L Barbee
(74) *Attorney, Agent, or Firm* — Moser Taboada; Alan Taboada

(57) ABSTRACT

Methods for calculating a self-bias on a substrate in a process chamber may include measuring a DC potential of a substrate disposed on a substrate support of a process chamber while providing a bias power from a power source to a cathode at a first frequency; measuring a voltage, current and phase shift at a matching network coupled to the power source while providing the bias power; calculating an effective impedance of the cathode by determining a linear relationship between a calculated voltage and the measured DC potential of the substrate; calculating a first linear coefficient and a second linear coefficient of the linear relationship between the calculated voltage and the measured DC potential of the substrate; and calculating a self bias on the substrate by utilizing the first linear coefficient, second linear coefficient, measured DC potential of the substrate, effective impedance, and measured phase shift.

20 Claims, 3 Drawing Sheets

SELF-BIAS CALCULATION ON A SUBSTRATE IN A PROCESS CHAMBER WITH BIAS POWER FOR SINGLE OR MULTIPLE FREQUENCIES

CROSS-REFERENCE TO RELATED APPLICATIONS

This application claims benefit of U.S. provisional patent application Ser. No. 61/552,561, filed Oct. 28, 2011, and U.S. provisional patent application Ser. No. 61/639,406, filed Apr. 27, 2012, which are herein incorporated by reference.

FIELD

Embodiments of the present invention generally relate to semiconductor processing.

BACKGROUND

Conventional process chambers utilizing an electrostatic chuck typically include a grid, or mesh electrode, embedded within the chuck that is biased negatively to create a static potential difference with the substrate, thereby chucking the substrate. The potential difference must be maintained at such a level as to prevent the substrate the moving during processing, or alternatively, prevent overchucking, which may lead to substrate breakage or improper cooling. To ascertain the proper potential difference, a self-bias of the substrate (e.g., a bias of the substrate due to capacitive coupling of the substrate during processing) must be calculated. However, the inventors have observed that conventionally used methodologies for calculating self-bias on a substrate in a process chamber may result in an inaccurate estimation of potential difference needed to properly chuck the substrate to a substrate support during processing. Moreover, conventional methodologies are typically only implemented for cases where a single bias power is used.

Therefore, the inventors have provided methods for calculating self-bias on a substrate in a process chamber utilizing substrate bias power having single or multiple frequencies.

SUMMARY

Methods for calculating self-bias on a substrate in a process chamber utilizing bias power having single or multiple frequencies are provided herein. In some embodiments, a method for calculating a self-bias on a substrate in a process chamber may include measuring a DC potential of a substrate disposed on a substrate support of a process chamber while providing a bias power from a power source to a cathode at a first frequency; measuring a voltage, a current and a phase shift at a matching network coupled to the power source while providing the bias power at the first frequency; calculating an effective impedance of the cathode by determining a linear relationship between a calculated voltage and the measured DC potential of the substrate, wherein the calculated voltage is a function of the effective impedance, measured voltage, current and phase shift; calculating a first linear coefficient and a second linear coefficient of the linear relationship between the calculated voltage and the measured DC potential of the substrate; and calculating a self bias on the substrate by utilizing the first linear coefficient, second linear coefficient, measured DC potential of the substrate, effective impedance, and measured phase shift.

In some embodiments, a computer readable medium, having instructions stored thereon that, when executed, cause a method for calculating a self-bias on a substrate in a process chamber to be performed. The method may include measuring a DC potential of a substrate disposed on a substrate support of a process chamber while providing a bias power from a power source to a cathode at a first frequency; measuring a voltage, a current and a phase shift while providing the bias power at the first frequency; calculating an effective impedance of the cathode by determining a linear relationship between a calculated voltage and the measured DC potential of the substrate, wherein the calculated voltage is a function of the effective impedance, measured voltage, current and phase shift; calculating a first linear coefficient and a second linear coefficient of the linear relationship between the calculated voltage and the measured DC potential of the substrate; and calculating a self bias on the substrate by utilizing the first linear coefficient, second linear coefficient, measured DC potential of the substrate, effective impedance, and measured phase shift.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
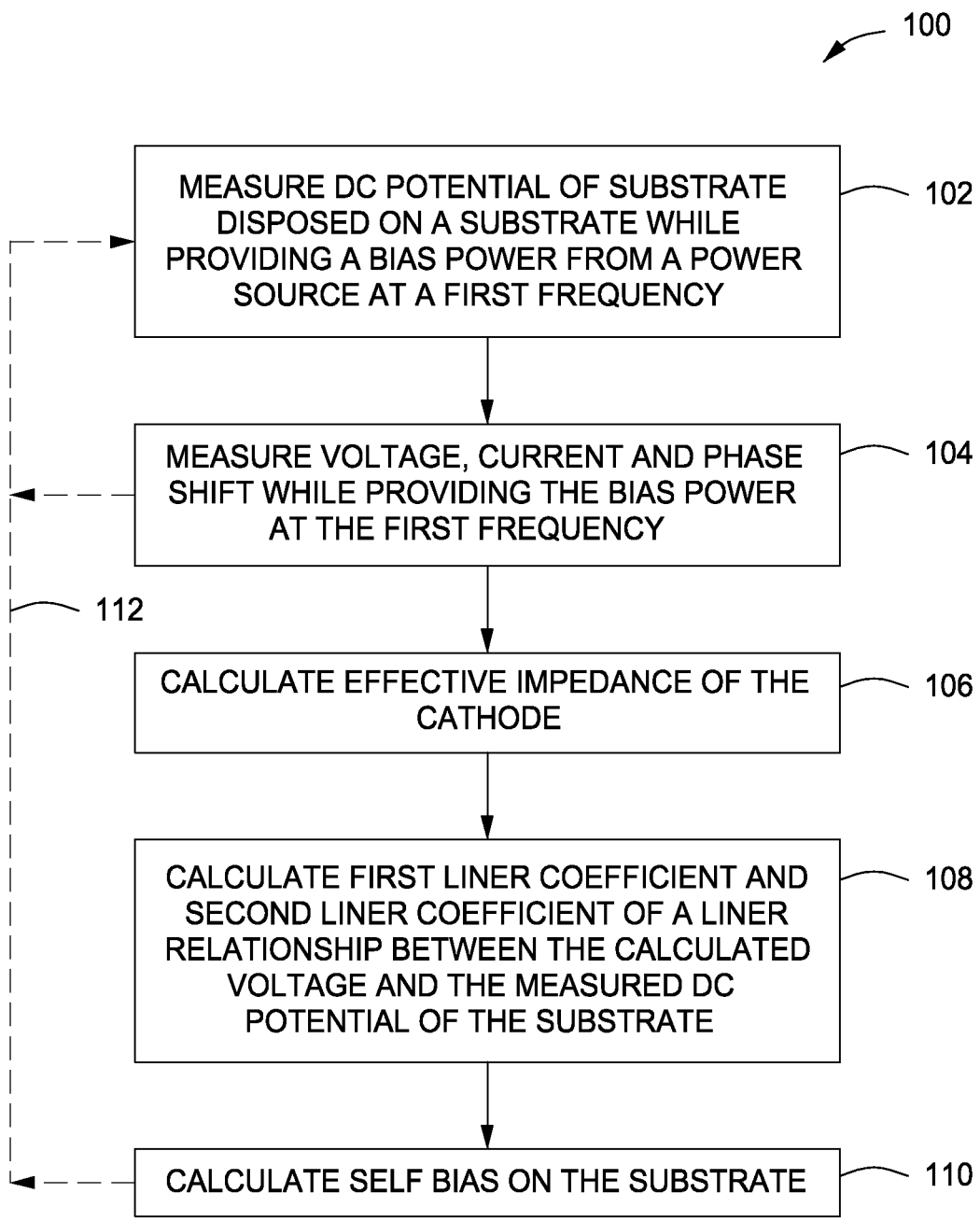
FIG. 1 depicts a method for calculating self-bias on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for calculating self-bias on a substrate in a plasma chamber utilizing bias power having single or multiple frequencies. In some embodiments, the inventive methods may advantageously provide an accurate calculation of self bias as compared to conventionally used methods. In some embodiments, the inventive method may be utilized to ascertain an optimal configuration for a particular type of process chamber which may then used to configure subsequently fabricated process chambers of the same type, thereby facilitating enhanced matching of process chamber performance between different process chambers.

The inventors have observed that conventional methodologies for calculating self-bias on a substrate in a process chamber typically include measuring impedance at a cathode (substrate support) and then obtaining an estimated peak voltage at the substrate via modeling. A plasma potential value is roughly estimated to obtain a self-bias potential compared to ground. However, the inventors have observed that this methodology relies on approximations and a too simple self-bias model at the substrate. For example, observed self-bias models do not take into account non-linearities that may be present within the process chamber, some of which are due to the fact that the process chamber is not symmetrical from a bias coupling point of view. In addition, this cathode impedance measurement may not be accurate due to a difference in an RF path when plasma is present in the process chamber, as opposed to an RF path when no plasma is present. Moreover, the conventional observed methodologies may only be implemented when a single bias power is used in the process chamber.

Accordingly, the inventors have provided an improved method for calculating self-bias on a substrate. FIG. 1 depicts a method 100 for calculating self-bias on a substrate in accordance with some embodiments of the present invention. The inventive methods may be utilized in conjunction with any type of process chamber utilizing bias power having single or multiple frequencies, for example, such as the process chamber described below with respect to FIG. 3.

The method 100 begins at 102 where a DC potential of a substrate (Vdc_meas) is measured while providing a bias power from a power source at a first frequency. In some embodiments, the bias power may be provided to a cathode (e.g., substrate), for example, such as the substrate support (cathode) 316 described below.

The DC potential of the substrate (Vdc_meas) may be measured in any manner suitable to accurately measure a DC potential while providing the bias power at a desired power and frequency. For example, in some embodiments, the DC potential of the substrate (Vdc_meas) may be measured by coupling or touching a sensor or probe (e.g., probe 327 described below) to the substrate and obtaining the measurement from the probe. The probe may be any type of probe suitable to obtain accurate DC voltage measurements. For example, in some embodiments, the probe may comprise a conductive wire disposed within the process chamber. In such embodiments, the probe may include a shell surrounding the wire to prevent electrical interference between the probe and a plasma when present in the process chamber. The shell may be fabricated from any suitable material, for example a dielectric material such as a ceramic.

The substrate may be any type of substrate suitable to obtain an accurate DC potential measurement. For example, in some embodiments, the substrate may be a test substrate fabricated from the same material as a production substrate that may be subsequently processed in the process chamber (such as silicon (Si), silicon-germanium (Si—Ge), or the like). Alternatively, the substrate may be fabricated from a conductive metal, for example such as aluminum. Utilizing a first substrate fabricated from a conductive metal provides an equal electrical potential across the substrate while performing the method, thereby providing accurate DC potential measurements.

The bias power may be provided by any type of power source capable of providing sufficient power at a desired frequency that is suitable for semiconductor processing, for example, such as an RF power source. In some embodiments, the power source may provide the bias power at a frequency (e.g., the first frequency), of 2 MHz, 13.56 MHz, or the like.

Next, at 104, a voltage (V_meas), a current (I_meas) and a phase shift (phase_meas) may be measured while providing the power at the first frequency. This measurement may be made simultaneous with, prior to, or subsequently to, measuring the DC potential of the substrate (Vdc_meas) at 102.

The voltage (V_meas), current (I_meas) and phase shift (phase_meas) may be measured at any point in the processing system suitable to provide measurements that accurately measure the conditions within the process chamber. For example, in some embodiments, the measurements may be made at an output of a matching network coupled to the power supply (e.g., such as matching network 324 shown in FIG. 3) or an input of a cathode.

In some embodiments, a plasma may be maintained in the process chamber while measuring the DC potential measurement (e.g., at 102), voltage, current, and phase shift. Maintaining the plasma while performing the measurements advantageously provides an environment similar to that of a process being performed in the process chamber, thereby allowing more accurate measurements to be made, as compared to performing the measurements without the presence of the plasma.

Next, at 106, an effective impedance (Zeff) of the cathode may be calculated. In some embodiments, to calculate the effective impedance (Zeff) of the cathode a linear relationship between a calculated voltage (V_cal) and the measured DC potential of the substrate (Vdc_meas) is determined.

In some embodiments, the calculated voltage is a function of the effective impedance, measured voltage, current and phase shift. Accordingly, the calculated voltage (V_cal) may be defined by:

$$V\_cal = |V\_meas + Zeff * I\_meas * e^{\wedge}(j*Phase\_meas)| \quad \text{[Equation 1]}$$

where V_meas is the measured voltage, Zeff is the effective impedance, I_meas is the measured current, phase_meas is the measured phase shift and j is a complex number. Thus, in some embodiments, a linear relationship between the measured DC potential of the substrate (Vdc_meas) and equation 1 is determined to calculate the effective impedance.

In some embodiments, the linear relationship is determined by calculating a Pearson Product-Moment Correlation Coefficient (r) between the calculated voltage (V_cal) and the measured DC potential of the substrate (Vdc_meas). In some embodiments, the Pearson Product-Moment Correlation Coefficient (r) between the calculated voltage (V_cal) and the measured DC potential of the substrate (Vdc_meas) may be defined as:

$$r = \frac{(|V\_meas + Zeff * I\_meas * e^{\wedge}(j*Phase\_meas)|) * Vdc\_meas}{\sqrt{(|V\_meas + Zeff * I\_meas * e^{\wedge}(j*Phase\_meas)|)} * \sqrt{(Vdc\_meas)}}$$

In such embodiments, the effective impedance (Zeff) of the cathode is determined when the Pearson Product-Moment Correlation Coefficient is about −1.

Next, at 108, a first linear coefficient and a second linear coefficient of the linear relationship between the calculated voltage (V_cal) and the measured DC potential of the substrate (Vdc_meas) are determined. In some embodiments, the first linear coefficient and the second linear coefficient are determined via a straight-line equation that defines the liner relationship between the calculated voltage (V_cal) and the measured DC potential of the substrate (Vdc_meas). For example, the linear relationship between the calculated voltage (V_cal) and the measured DC potential of the substrate (Vdc_meas) described above may be defined by the equation $$y = mx + b \quad \text{[Equation 2]}$$

where the m is the slope and b is the y-intercept, or shift. In such embodiments, the slope is the first linear coefficient and the shift is the second linear coefficient.

Next, at 110, the self-bias on the substrate (Vdc_cal) may be calculated by utilizing the effective impedance Zeff and the voltage, current, and phase shift measurements. In some embodiments, the self-bias on the substrate may be defined by the following equation $$(Vdc\_cal) = \text{First linear coefficient} * |V\_meas| + Zeff * I\_meas * e^{\hat{}}(j*Phase\_meas)| + \text{Second linear coefficient} \quad \text{[Equation 3]}$$

Following the calculation of the self-bias on the substrate (Vdc_cal) at 110, the method ends and the calculated self-bias (Vdc_cal) may be utilized to configure the process chamber for processing or to configure a subsequently configured process chamber of a similar type or function.

Although the method 100 as described above describes the measurements (e.g., the DC potential, voltage, current and phase shift) as taken at a frequency (e.g., the first frequency), in some embodiments, the measurements may be taken at multiple frequencies and subsequent calculations may be made to provide a total value of the self bias on the substrate (Vdc_cal). The measurements may be taken at any point during the method 100, for example such as simultaneous with, or subsequent to the measurements taken at the first frequency (e.g., at 102 and 104), such as indicated by arrow 112 in FIG. 1. For example, in some embodiments, such as where a process chamber is configured to perform processes at multiple frequencies, the method 100 may be repeated such that the measurements taken at 102 and 104 are repeated for each frequency (e.g., a first frequency and a second frequency). In such embodiments, the subsequent calculations performed at 106 and 108 are also performed for each frequency. The self bias on the substrate (Vdc_cal) for each frequency is then added to provide a total self-bias on the substrate for the process chamber.

Figure 2:
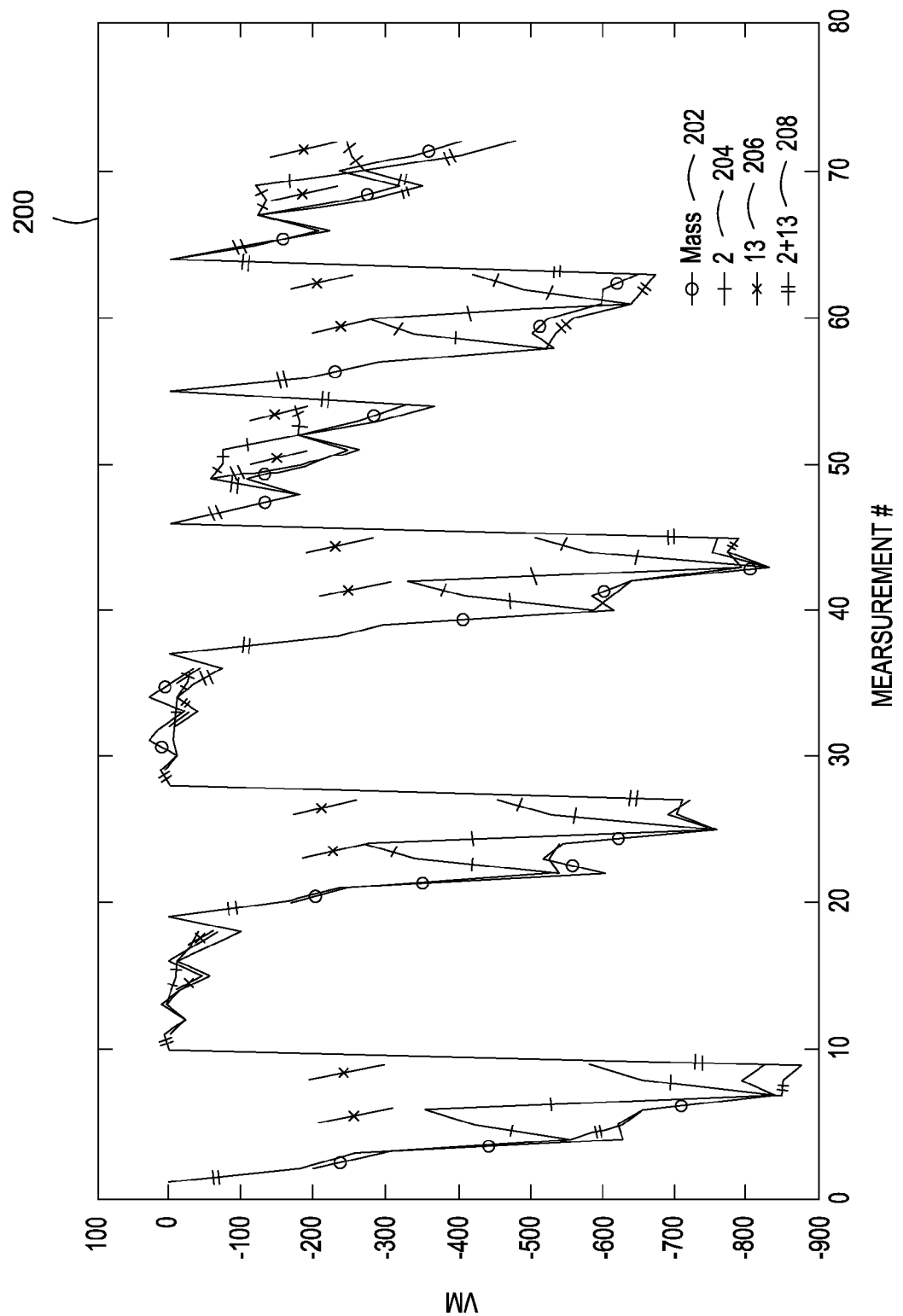
FIG. 2 depicts a graph showing testing results for the inventive method for calculating self-bias on a substrate in a process chamber utilizing bias power having single or multiple frequencies in accordance with some embodiments of the present invention.

FIG. 2 depicts a graph 200 showing results of intermediate testing of a measured self-bias of a substrate and a calculated self bias. Shown in FIG. 2 are the measured self-bias of the substrate 202, the calculation for the self-bias of a substrate at 13.56 MHz 206, for 2 MHz 204, and the sum of both 208. The inventors have observed a good agreement and high accuracy between the measured self-bias of the substrate and the calculated self-bias, at single frequency (13.56 MHz or 2 MHz) or dual frequency (13.56 MHz and 2 MHz).

The inventive methods may be utilized in conjunction with any type of process chamber utilizing bias power having single or multiple frequencies. Exemplary process chambers include any process chamber used for etching processes, for example, such as the ADVANTEDGE™, or other process chambers, available from Applied Materials, Inc. of Santa Clara, Calif. Other process chambers, including those from other manufacturers, may similarly be used.

Figure 3:
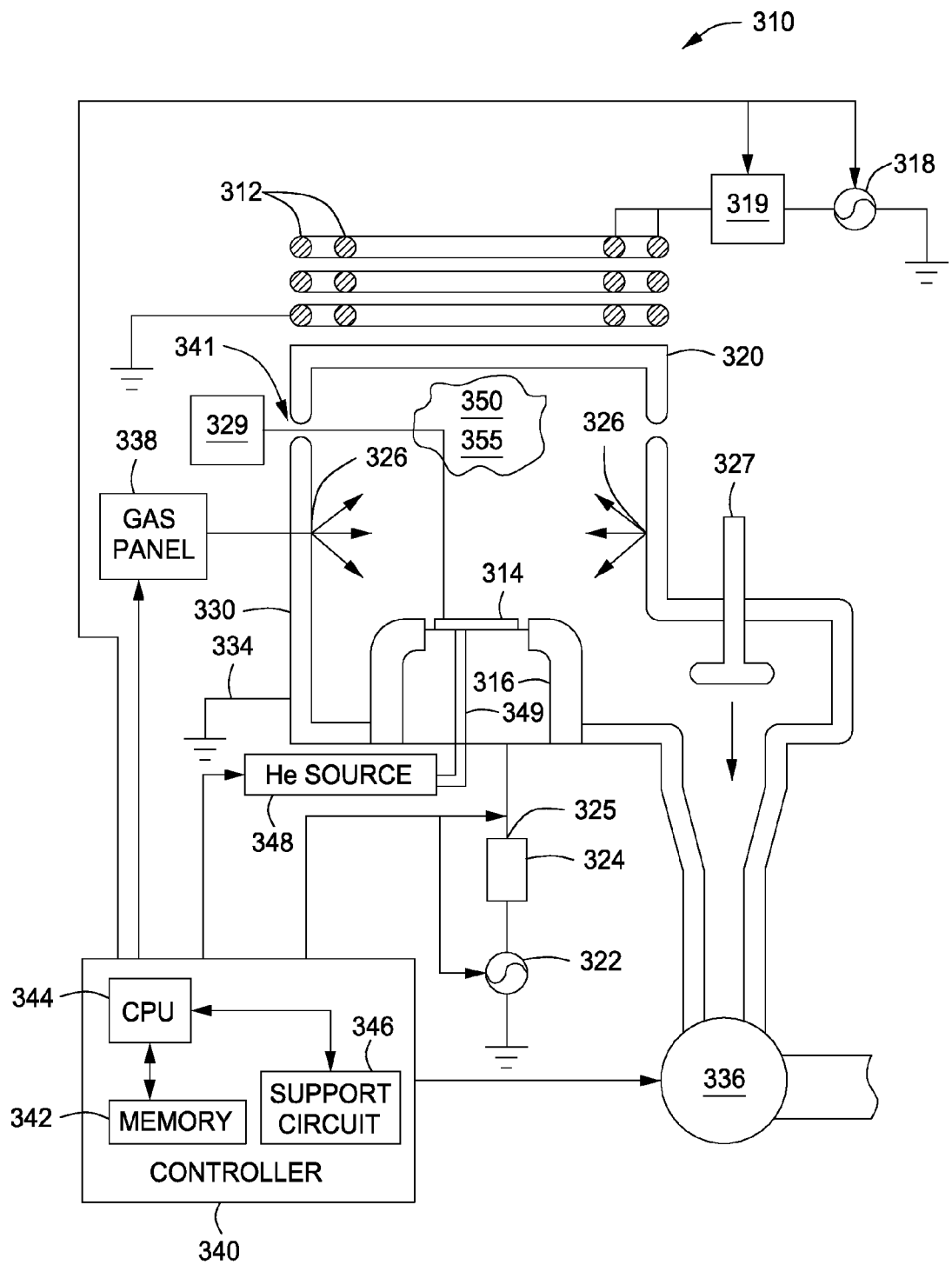
FIG. 3 depicts a process chamber suitable to perform a method for calculating self-bias on a substrate in accordance with some embodiments of the present invention.

For example, FIG. 3 depicts a schematic diagram of an illustrative process chamber 300 of the kind that may be used to practice embodiments of the invention as discussed herein. The process chamber 300 may be utilized alone or as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other process chambers and/or cluster tools may suitably be used as well.

The process chamber 300 generally comprises a chamber 310 having a substrate support (cathode) 316 within a conductive body (wall) 330, and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. In some embodiments, the plasma power source 318 may be capable of producing up to 3000 W at a tunable frequency in a range from 50 kHz to 13.56 MHz.

The substrate support 316 may include an electrostatic chuck for retaining the substrate 314 and is coupled, through a second matching network 324 having an matching network output (cathode input) 325, to a biasing power source 322. In some embodiments, the biasing power source 322 may be capable of producing up to 1500 W at a frequency of approximately 13.56 MHz. The biasing power may be either continuous or pulsed power. In some embodiments, the biasing power source 322 may be a DC or pulsed DC source. In some embodiments, a probe 327 may be disposed within the chamber 330 proximate the substrate support 316 to provide measurements (e.g., the first DC voltage measurement of the substrate described above) within the process chamber 310. The probe 327 may be fed out of the chamber 310 via a port 341 disposed in the wall 330 of the chamber 310. In some embodiments, a controller 329 may be coupled to the probe 327 to facilitate recording or displaying the measurements of the probe 327.

The controller 340 generally comprises a central processing unit (CPU) 344, a memory 342, and support circuits 346 for the CPU 344 and facilitates control of the components of the chamber 310 and, as such, of the etch process, as discussed below in further detail.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

In an exemplary operation of the process chamber 300 as described above, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode 316, respectively. The pressure within the interior of the chamber 310 is controlled using a throttle valve 331 and a vacuum pump 336. Typically, the wall 330 is coupled to an electrical ground 334. The temperature of the wall 330 may be controlled using liquid-containing conduits (not shown) that run through the wall 330.

In some embodiments, the temperature of the substrate 314 may be controlled by stabilizing a temperature of the substrate support 316. In some embodiments, a gas from a gas source 348 is provided via a gas conduit 349 to channels (not shown) formed in the pedestal surface under the substrate 314. The gas is used to facilitate heat transfer between the substrate support 316 and the substrate 314. During processing, the substrate support 316 may be heated by a resistive heater (not shown) within the substrate support 316 to a steady state temperature and then the helium gas facilitates uniform heating of the substrate 314.

Thus, methods for calculating self-bias on a substrate in a process chamber utilizing bias power having single or multiple frequencies. In some embodiments, the inventive methods may advantageously provide an accurate calculation of self bias as compared to conventionally used methods.

While the foregoing is directed to embodiments of the present invention, other and further embodiments of the invention may be devised without departing from the basic scope thereof.

The invention claimed is:

1. A method for calculating a self-bias on a substrate in a process chamber, comprising:
   measuring a DC potential of a substrate disposed on a substrate support of a process chamber while providing a bias power from a power source to a cathode at a first frequency, wherein the DC potential is measured by a probe that contacts the substrate within the process chamber;
   measuring a voltage, a current and a phase shift while providing the bias power at the first frequency;
   calculating, by a central processing unit of a controller, an effective impedance of the cathode by determining a linear relationship between a calculated voltage and the measured DC potential of the substrate, wherein the calculated voltage is a function of the effective impedance, measured voltage, current and phase shift;
   calculating, by the central processing unit, a first linear coefficient and a second linear coefficient of the linear relationship between the calculated voltage and the measured DC potential of the substrate; and
   calculating, by the central processing unit, a self bias on the substrate by utilizing the first linear coefficient, second linear coefficient, measured DC potential of the substrate, effective impedance, and measured phase shift.

2. The method of claim 1, wherein the voltage, current and phase shift is measured at an output of a matching network coupled to the power source or an input of the cathode while providing the bias power at the first frequency.

3. The method of claim 1, wherein the first linear coefficient is a slope and the second linear coefficient is the shift of the linear relationship between the calculated voltage and the measured DC potential of the substrate.

4. The method of claim 1, wherein the self bias is defined by:
   the first linear coefficient * |V_meas +Zeff*I_meas*e^(j*Phase_meas)|+the second linear coefficient,
   wherein V_meas is the measured DC potential of the substrate, Zeff is the effective impedance, I_meas is the measured current, Phase_meas is the measured phase shift, and j is a complex number.

5. The method of claim 1, wherein the calculated voltage is defined by:

$$|V\_meas+Zeff*I\_meas*e\char`^(j*Phase\_meas)|$$

wherein V_meas is the measured DC potential of the substrate, Zeff is the effective impedance, I_meas is the measured current, and Phase_meas is the measured phase shift, and j is a complex number.

6. The method of claim 1, wherein determining the linear relationship between the calculated voltage and the measured DC potential of the substrate comprises:
   calculating a Pearson product-moment correlation coefficient (r) between the calculated voltage and the measured DC potential, wherein the linear relationship is determined when the Pearson product-moment correlation coefficient (r) is about −1.

7. The method of claim 1, further comprising:
   repeating the method by measuring the DC potential of the substrate at a second frequency, and measuring the voltage, the current and the phase shift at the matching network at a second frequency;
   calculating the effective impedance, first linear coefficient, second linear coefficient and self bias utilizing the DC potential, voltage, current and phase shift measured at the second frequency; and
   adding the self-bias calculated at the first frequency to the self-bias calculated at the second frequency to get a total self-bias.

8. The method of claim 1, wherein measuring the first DC voltage of the substrate comprises:
   touching a probe to the substrate; and
   obtaining the DC potential of a substrate measurement from the probe.

9. The method of claim 8, further comprising:
   measuring the voltage, the current, and the phase shift while touching the probe to the substrate.

10. The method of claim 1, further comprising:
    forming a plasma in the process chamber; and
    measuring the DC potential of the substrate at a second frequency, and measuring the voltage, the current, and the phase shift at the matching network while a plasma is present in the process chamber.

11. A non-transitory computer readable medium, having instructions stored thereon that, when executed, cause a method for calculating a self-bias on a substrate in a process chamber to be performed, the method comprising:
    measuring a DC potential of a substrate disposed on a substrate support of a process chamber while providing a bias power from a power source to a cathode at a first frequency, wherein the DC potential is measured by a probe that contacts the substrate;
    measuring a voltage, a current and a phase shift while providing the bias power at the first frequency;
    calculating, by a central processing unit of a controller, an effective impedance of the cathode by determining a linear relationship between a calculated voltage and the measured DC potential of the substrate, wherein the calculated voltage is a function of the effective impedance, measured voltage, current and phase shift;
    calculating, by the central processing unit, a first linear coefficient and a second linear coefficient of the linear relationship between the calculated voltage and the measured DC potential of the substrate; and
    calculating, by the central processing unit, a self bias on the substrate by utilizing the first linear coefficient, second linear coefficient, measured DC potential of the substrate, effective impedance, and measured phase shift.

12. The non-transitory computer readable medium of claim 11, wherein the voltage, current and phase shift is measured at an output of a matching network coupled to the power source or an input of the cathode while providing the bias power at the first frequency.

13. The non-transitory computer readable medium of claim 11, wherein the first linear coefficient is a slope and the second linear coefficient is the shift of the linear relationship between the calculated voltage and the measured DC potential of the substrate.

14. The non-transitory computer readable medium of claim 11, wherein the self bias is defined by:
- the first linear coefficient * |V_meas +Zeff*I_meas*e^(j*Phase_meas)|+the second linear coefficient,
- wherein V_meas is the measured DC potential of the substrate, Zeff is the effective impedance, I_meas is the measured current, Phase_meas is the measured phase shift, and j is a complex number.

15. The non-transitory computer readable medium of claim 11, wherein the calculated voltage is defined by:

$$|V\_meas+Zeff*I\_meas*e^{(j*Phase\_meas)}|$$

wherein V_meas is the measured DC potential of the substrate, Zeff is the effective impedance, I_meas is the measured current, Phase_meas is the measured phase shift, and j is a complex number.

16. The non-transitory computer readable medium of claim 11, wherein determining the linear relationship between the calculated voltage and the measured DC potential of the substrate comprises:
- calculating a Pearson product-moment correlation coefficient (r) between the calculated voltage and the measured DC potential, wherein the linear relationship is determined when the Pearson product-moment correlation coefficient (r) is about −1.

17. The non-transitory computer readable medium of claim 11, wherein the method further comprises:
- repeating the method by measuring the DC potential of the substrate at a second frequency, and measuring the voltage, the current and the phase shift at the matching network at a second frequency;
- calculating the effective impedance, first linear coefficient, second linear coefficient and self bias utilizing the DC potential, voltage, current and phase shift measured at the second frequency; and
- adding the self-bias calculated at the first frequency to the self-bias calculated at the second frequency to get a total self-bias.

18. The non-transitory computer readable medium of claim 11, wherein measuring the first DC voltage of the substrate comprises:
- touching a probe to the substrate; and
- obtaining the DC potential of a substrate measurement from the probe.

19. The non-transitory computer readable medium of claim 18, further comprising:
- measuring the voltage, the current and the phase shift while touching the probe to the substrate.

20. The non-transitory The computer readable medium of claim 11, further comprising:
- forming a plasma in the process chamber; and
- measuring the DC potential of the substrate at a second frequency, and measuring the voltage, the current and the phase shift at the matching network while a plasma is present in the process chamber.

* * * * *